(12) United States Patent
Miura

(10) Patent No.: US 9,130,480 B2
(45) Date of Patent: Sep. 8, 2015

(54) DEVICE FOR APPLYING HIGH VOLTAGE USING PULSE VOLTAGE, AND METHOD OF APPLYING HIGH VOLTAGE

(75) Inventor: Tomonori Miura, Gunma (JP)

(73) Assignee: Sawafuji Electric Co., Ltd., Gunma (JP)

( * ) Notice: Subject to any disclaimer, the term of this patent is extended or adjusted under 35 U.S.C. 154(b) by 637 days.

(21) Appl. No.: 13/395,905

(22) PCT Filed: Nov. 24, 2010

(86) PCT No.: PCT/JP2010/070906
§ 371 (c)(1),
(2), (4) Date: Apr. 12, 2012

(87) PCT Pub. No.: WO2011/065370
PCT Pub. Date: Jun. 3, 2011

(65) Prior Publication Data
US 2012/0223596 A1 Sep. 6, 2012

(30) Foreign Application Priority Data
Nov. 24, 2009 (JP) .................................. 2009-265941

(51) Int. Cl.
*H03K 3/017* (2006.01)
*H02M 7/5387* (2007.01)

(52) U.S. Cl.
CPC ... *H02M 7/53871* (2013.01); *H03K 2217/0045* (2013.01)

(58) Field of Classification Search
None
See application file for complete search history.

(56) References Cited

FOREIGN PATENT DOCUMENTS

| JP | 2001-035693 A | 2/2001 |
| JP | 2005-063760 A | 3/2005 |
| JP | 2005-340185 A | 12/2005 |
| JP | 2008-167584 A | 7/2008 |

OTHER PUBLICATIONS

Kim et al., "A Novel SLLC Series Resonant Converter for The Boost DC/DC Converter", thesis published Feb. 2007, pp. 56-64.

*Primary Examiner* — Rexford Barnie
*Assistant Examiner* — David Shiao
(74) *Attorney, Agent, or Firm* — Carrier Blackman & Associates, P.C.; Joseph P. Carrier; William D. Blackman

(57) ABSTRACT

A device for applying a high voltage using a pulse voltage is provided which applies a high voltage having a pulse width $\tau_0$ to a capacitive load (1) through a pulse transformer (4), the high voltage having pulse-like peaks with a steep leading edge, wherein a capacitance $C_1$ of the capacitive load (1) and a secondary side leakage inductance $L_1$ of the pulse transformer (4) satisfy the equation: $L_1 = (\tau_0/\pi)^2 \times (1/C_1)$. This enables enlargement of the pulse-like peaks and application of any pulse repetition frequency when the high voltage having the pulse-like peaks is applied to the capacitive load through the pulse transformer.

3 Claims, 7 Drawing Sheets

DEVICE FOR APPLYING HIGH VOLTAGE USING PULSE VOLTAGE, AND METHOD OF APPLYING HIGH VOLTAGE

TECHNICAL FIELD

The present invention relates to a device for applying a high voltage using a pulse voltage, and a method of applying the high voltage, for use as a plasma generation power source that is used for the generation of ozone, etc.

BACKGROUND ART

A plasma generation power source device that is used for the generation of ozone, etc. is known. As this type of power source device, Patent Document 1 or Patent Document 2 is known. On the other hand, with regard to a device for applying a high voltage, the present applicant filed an application as shown in Patent Document 3 on 28 Dec. 2006.

The arrangements shown in Patent Document 1 and Patent Document 2 use, in order to apply a high voltage to a capacitive load, a transformer to which is supplied an alternating voltage corresponding to a sine wave so to speak, and are constructed such that, with respect to the capacitive load connected to the secondary side of said transformer, an inductance is connected to said capacitive load, an alternating voltage having a frequency corresponding to the resonant frequency of said capacitive load and said inductance being supplied to the transformer.

On the other hand, in Patent Document 3, under an arrangement in which a capacitive load is connected via a pulse transformer, a so to speak triangular-shaped waveform high voltage having a steep leading edge and gradual trailing edge is generated, and a high voltage is applied using an alternating pulse wave voltage having a predetermined repetition period.

In addition, with regard to a device that applies a high voltage to said capacitive load, a method in which, when for example removing nitrogen oxides ($NO_x$) or sulfur oxides ($SO_x$) in combustion exhaust gas, low temperature plasma such as a streamer discharge or a glow discharge is used has been considered, and it is used as means for removing nitrogen oxides or sulfur oxides in this case.

RELATED ART DOCUMENTS

Patent Documents

Patent Document 1: Japanese Patent Application Laid-open No. 2005-340185
Patent Document 2: Japanese Patent Application Laid-open No. 2005-63760
Patent Document 3: Japanese Patent Application Laid-open No. 2008-167584

SUMMARY OF THE INVENTION

Problems to be Solved by the Invention

In the arrangement disclosed in Patent Document 3, a switching element is used as a power source device so as to a apply triangular wave voltage having a steep leading edge via a pulse transformer. However, there is a limit in circuit design for making the leading edge steep, and the rise time T (rise) (time required for leading edge) of a waveform includes a delay due to circuit design, as described in FIG. 3 later the rise time T (rise) (period of (a) in the drawing) of a waveform being given by $$T(\text{rise}) = T(r \cdot \text{delay}) + 5\tau(\text{rise})$$

T(r·delay): total of leading edge delay time of PWM switching regulator IC, one-shot IC, photocoupler, and semiconductor switching element SW
τ(rise): time constant due to equivalent capacitance C of capacitive load 1 and combined resistance value $R_t$ of switching circuit, current limiting inductance, pulse transformer, wiring, etc. (since multiplying said time constant by '4.605' gives a value that is 99% of the peak value, multiplying the time constant by '5' is defined as giving the time for it to attain the peak value).

It is an object of the present invention to generate a higher voltage and apply any pulse repetition frequency to a capacitive load under an arrangement in which an alternating voltage having a predetermined period pulse component is applied, disclosed in Patent Document 3 above, irrespective of a so-called resonance phenomenon disclosed in Patent Document 1 and Patent Document 2 above.

Means for Solving the Problems

FIG. 1 shows the arrangement of one embodiment of the entirety of the present invention.

In the drawing, reference numeral 1 is a capacitive load that is a dielectric barrier discharge reactor (DBD Load), in which gas is excited by discharge to thus generate a plasma, 2 is a DC voltage supply circuit having a rectifying circuit and a smoothing circuit, 3 is a switching circuit that forms an inverter using a plurality of switching elements SWi, and 4 is a pulse transformer.

A switching element SWi preferably employs a MOS-FET, but a semiconductor switching element such as an IGBT or a transistor may be used.

Furthermore, 5 is a current detector, 6 is an amplifier circuit that gives a proportional voltage component that is proportional to a detected DC current component and an integrated voltage component that is formed by integrating said DC current component with a predetermined time constant, and 7 is an OR circuit that extracts the larger component between the proportional voltage component and the integrated voltage component.

Moreover, 8 is an oscillator circuit that oscillates so as to produce rectangular pulses having a duty ratio of for example 50%, but is controlled with a set period so as to output rectangular pulses having a duty ratio of 50% or less, for example 25% rectangular pulses, in response to the level of the output of the OR circuit 7, and is set so as to output rectangular pulses having a duty ratio of 0% (that is, oscillation stopped) when the output of the OR circuit 7 exceeds a limit.

Further, 9 is a short pulse generation circuit that generates rectangular pulses having a predetermined duty ratio of for example 10% with the leading edge point of the output from the oscillator circuit 8 as a reference. Furthermore, 10 is a gate drive circuit that receives an output from the short pulse generation circuit 9 and generates a gate control signal for the switching element SWi.

In the switching circuit 3, in principle, when the switching elements SW1 and SW4 are turned ON, current flowing through the pulse transformer 4 from the top to the bottom in the drawing is supplied, whereas when the switching elements SW2 and SW3 are turned ON, current flowing through the pulse transformer 4 from the bottom to the top in the drawing is supplied. That is, a positive-going triangular wave and negative-going triangular wave having a steep leading edge and a relatively gradual trailing edge are applied to the capacitive load 1 so as to correspond to the oscillation frequency of the oscillator circuit 8.

In other words, since the duty ratio of the rectangular pulses from the short pulse generation circuit 9 is a value of 50% or less, the above-mentioned triangular wave having a steep leading edge and a relatively gradual trailing edge is applied.

The voltage on the secondary side of the pulse transformer 4 shown in FIG. 1 is the triangular wave voltage, that is, an alternating voltage having
(i) a pulse wave component corresponding to the steep leading edge and
(ii) a decaying wave component corresponding to the gradual trailing edge,
said alternating voltage being applied to the capacitive load 1.

In this process, the relationship between a secondary side leakage inductance $L_1$ of the pulse transformer 4 and a pulse width $\tau_0$ of the pulse wave component in the present invention is set so as to be a value that satisfies $$L_1 = (\tau_0/\pi)^2 \times (1/C_1) \quad (1)$$

wherein the capacitance of the capacitive load 1 is $C_1$.

That is, by use of the capacitance $C_1$ of the capacitive load 1, the secondary side leakage inductance of the pulse transformer 4 is selected by the pulse width $\tau_0$ or the pulse width $\tau_0$ is determined by the secondary side leakage inductance of the pulse transformer 4, irrespective of the pulse repetition period.

Effects of the Invention

In the present invention, an alternating voltage having a pulse repetition period with a pulse width of $\tau_0$, obtained as a triangular wave voltage having a steep leading edge, is generated, the maximum power efficiency and output voltage of the alternating voltage enable a high voltage to be applied to a capacitive load at any repetition period, and as a result it becomes possible to remove for example nitrogen oxides or sulfur oxides in exhaust gas with a low power input. Furthermore, it becomes possible to make a transformer that supplies a high voltage to a capacitive load small in size, light in weight, and low in cost.

EXPLANATION OF REFERENCE NUMERALS AND SYMBOLS

Figure 1:
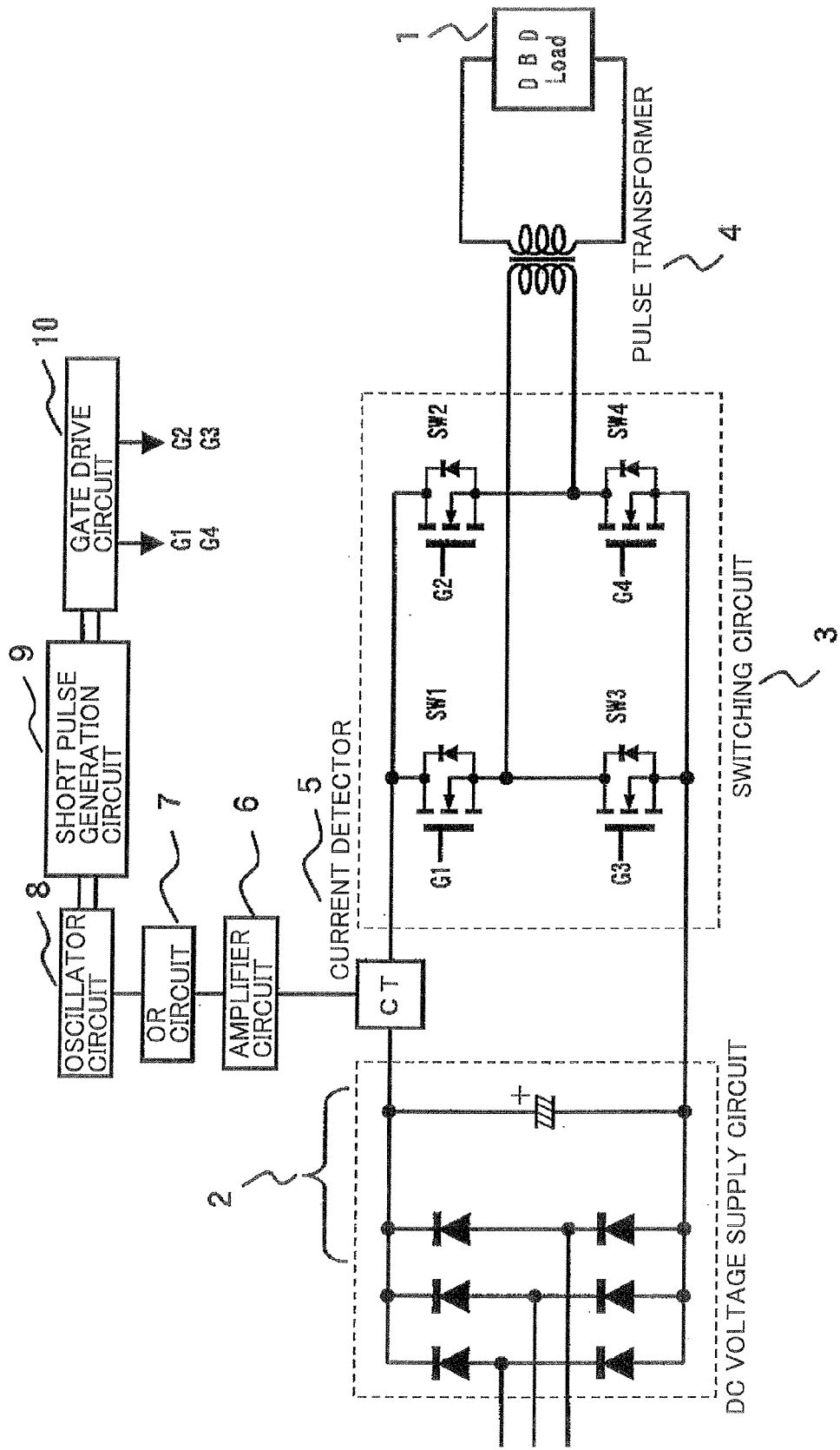
FIG. 1 shows the arrangement of one embodiment of the entirety of the present invention. (first embodiment)

1: Capacitive load
2: DC voltage supply circuit
3: Switching circuit
4: Pulse transformer
5: Current detector
6: Amplifier circuit
7: OR circuit
8: Oscillator circuit
9: Short pulse generation circuit
10: Gate drive circuit

MODE FOR CARRYING OUT THE INVENTION

A mode for carrying out the present invention is explained below by reference to the attached drawings.

Embodiment 1

Figure 2:
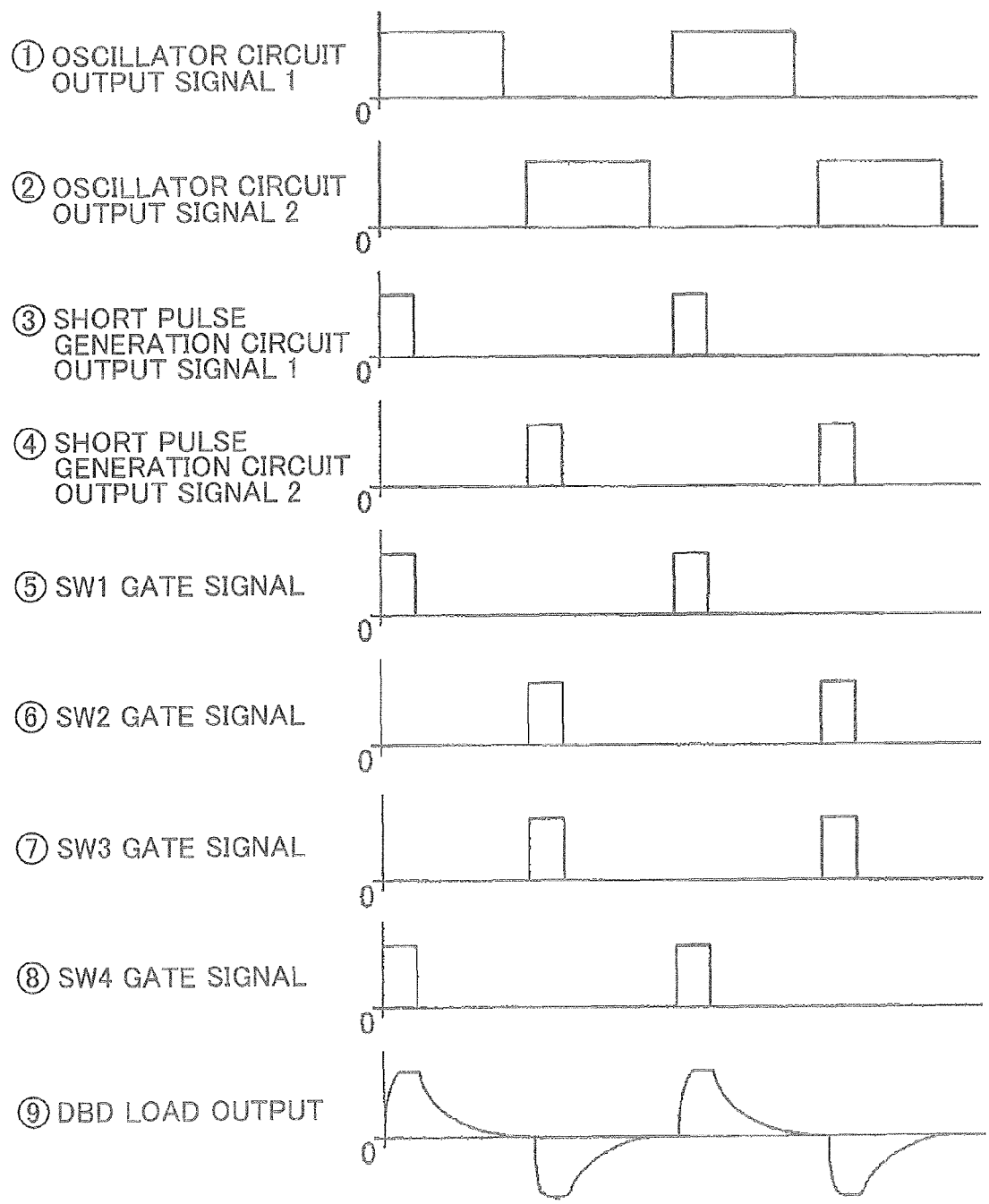
FIG. 2 shows waveform charts of each section. (first embodiment)

The device for applying a high voltage of the present invention has an arrangement as shown in FIG. 1, and FIG. 2 shows waveform charts of each section.

[1], [2]: An oscillator circuit 8 oscillates so as to produce two trains of rectangular pulses having displaced phases. There is actually a predetermined 'simultaneous OFF period' between 'oscillator circuit output signal 1' and 'oscillator circuit output signal 2', but in the present specification such a case is also called a rectangular pulse having a duty ratio of 50% for simplicity.

[3], [4]: A short pulse generation circuit 9 generates short pulses that rise so as to correspond to the timing of the leading edge of each of the 'oscillator circuit output signal 1' and the 'oscillator circuit output signal 2' illustrated. That is, it generates 'short pulse generation circuit output signal 1' and 'short pulse generation circuit output signal 2'.

[5], [6], [7], [8]: Gate signals applied to switching elements SW1 to SW4 are as illustrated based on the 'short pulse generation circuit output signal 1' and the 'short pulse generation circuit output signal 2'.

[9]: Positive-going and negative-going triangular waves having steep leading edges and gradual trailing edges are applied to a capacitive load via a pulse transformer 4.

Figure 3:
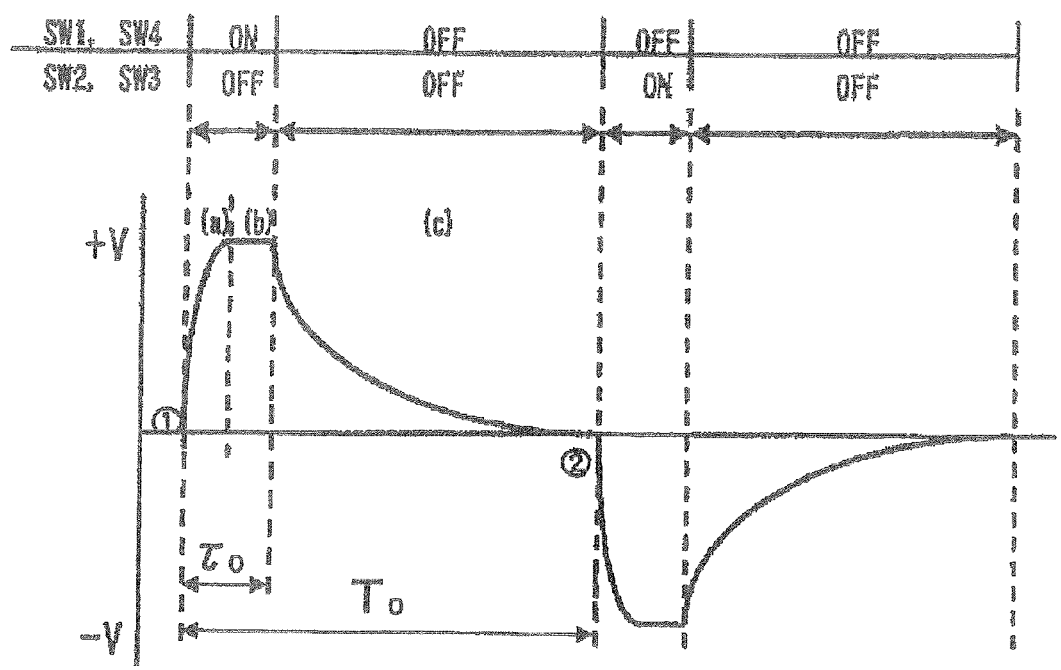
FIG. 3 shows a high voltage waveform that is applied to a capacitive load with the ON/OFF timing of a switching element. (first embodiment)

FIG. 3 shows the high voltage waveform that is applied to the capacitive load according to the ON and OFF timing of the switching elements.

The timing at which the switching elements SW1 and SW4 are turned ON is the point of time when the illustrated (a) starts, and the timing at which they are turned OFF is the point of time when the illustrated (b) ends, a rise time T(rise)

(period of the illustrated (a)) of the waveform shown in FIG. 3 being given by $$T(\text{rise})=T(r\cdot\text{delay})+5\tau(\text{rise})$$

T(r·delay): total of leading edge delay time of PWM switching regulator IC, one-shot IC, photocoupler, and semiconductor switching element SW τ(rise): time constant due to equivalent capacitance C of capacitive load 1 and combined resistance value $R_r$ of switching circuit, pulse transformer, wiring, etc. (since multiplying said time constant by '4.605' gives a value that is 99% of the peak value, multiplying the time constant by '5' is defined as giving the time for it to attain the peak value), for example.

Furthermore, a peak voltage holding time T(peak) (period of the illustrated (b)) is $$T(\text{peak})=T(\text{on})-T(\text{rise}).$$

T(on): pulse width set by the short pulse generation circuit (T(on) is set so that the sum of T(peak) and T(rise) is smaller than a trailing edge time T(fall), which is described later).

Furthermore, when the timing at which the switching elements SW1 and SW4 are turned OFF is defined as the point of time when the illustrated (c) starts, the trailing edge time T(fall) (period of the illustrated (c)) of waveform shown in FIG. 3 is $$T(\text{fall})=T(f\cdot\text{delay})+5\tau(\text{fall})$$

T(f·delay): total of leading edge delay time of PWM switching regulator IC, one-shot IC, photocoupler, and semiconductor switching element SW τ(fall): time constant due to equivalent capacitance C of the capacitive load 1 and a resistance $R_B$ of the capacitive load 1 (in this case also, it is assumed that multiplying by '5' gives the time for it to attain zero level).

Figure 4:
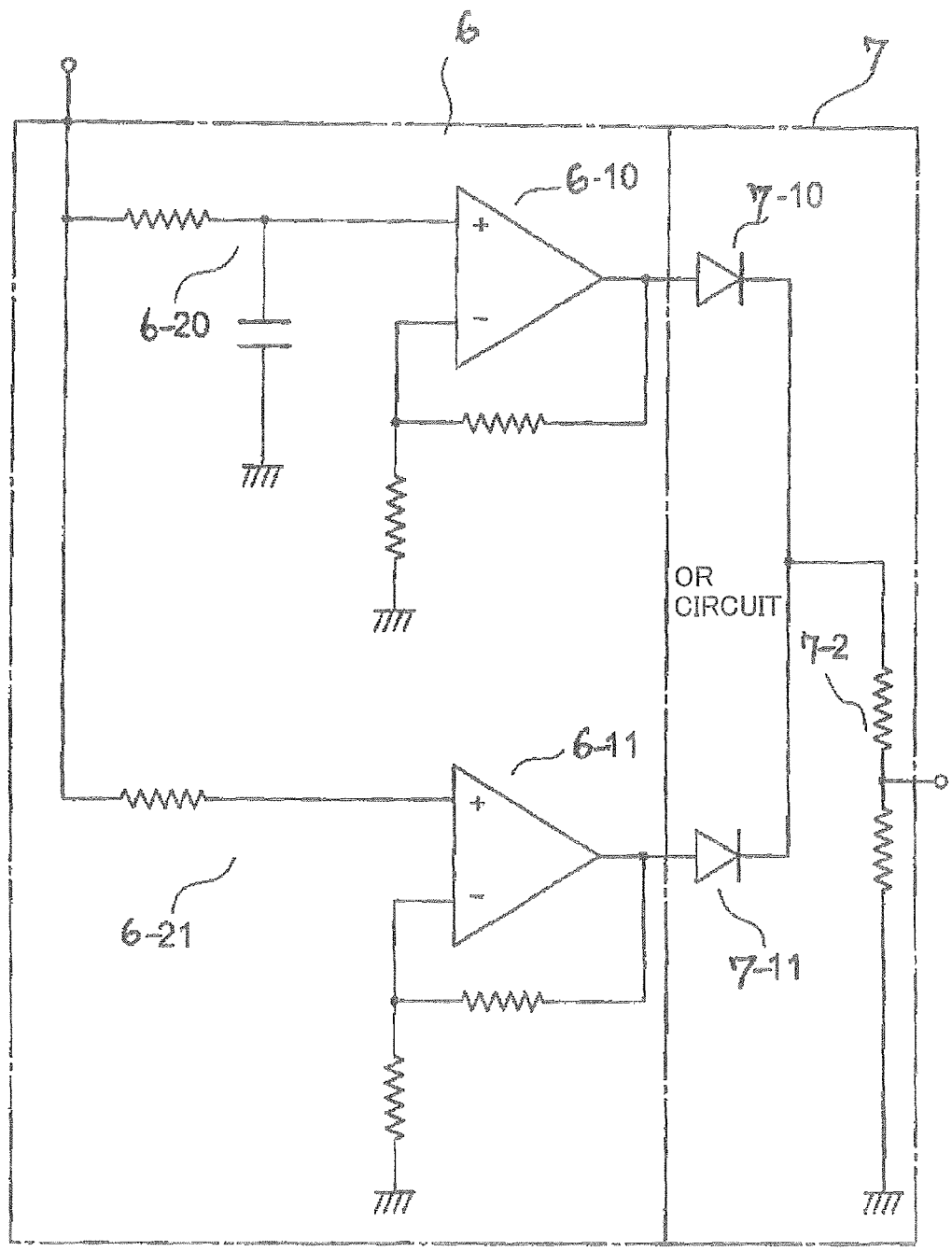
FIG. 4 shows a schematic diagram of the principle of an amplifier circuit and an OR circuit shown in FIG. 1. (first embodiment)

FIG. 4 shows a schematic diagram of the principle of an amplifier circuit and an OR circuit shown in FIG. 1. Reference numerals 6 and 7 in the drawing correspond to those of FIGS. 1, 6-10 and 6-11 denote amplifiers, 6-20 denotes a time constant circuit having a CR circuit and corresponds to an integrator circuit section, 6-21 denotes a proportional circuit section having a resistance circuit, 7-10 and 7-11 denote diodes, and 7-2 denotes a voltage divider.

A DC current component that is detected by a current detector 5 and is supplied to the amplifier circuit 6 is inputted into the amplifier 6-11 via the proportional circuit section 6-21 and is outputted as a proportional voltage component. The DC current component thus detected is inputted into the amplifier 6-10 via the integrator circuit section 6-20 and is outputted as an integrated voltage component.

The two voltage components are inputted into the OR circuit 7 formed from the diodes 7-10 and 7-11 and the voltage divider 7-2, and as is well known the component that has the larger value is selected, divided, and outputted. This output thus divided is supplied to the oscillator circuit 8 shown in FIG. 1.

As described above, when the high voltage having the steep leading edge is applied to the capacitive load 1, a large inrush current flows into the capacitive load 1. The DC current component outputted from the current detector 5 shown in FIG. 1 momentarily increases so as to respond to this inrush current, but as the inrush current decays the DC current component decreases. As a result, when the proportional voltage component and the integrated voltage component corresponding to the inrush current are supplied to the OR circuit 7, the output from the voltage divider 7-2 shown in FIG. 4 is, so to speak, a voltage in which only the peak value temporarily increases.

On the other hand, if a short circuit is generated in the capacitive load 1, a short circuit current accompanying the short circuit is sufficiently large and sustained timewise. From this, in the case of the DC current component that responds to the short circuit current detected by the current detector 5, the output from the voltage divider 7-2 of the OR circuit 7 is a voltage that is sustained over a predetermined level.

Figure 5:
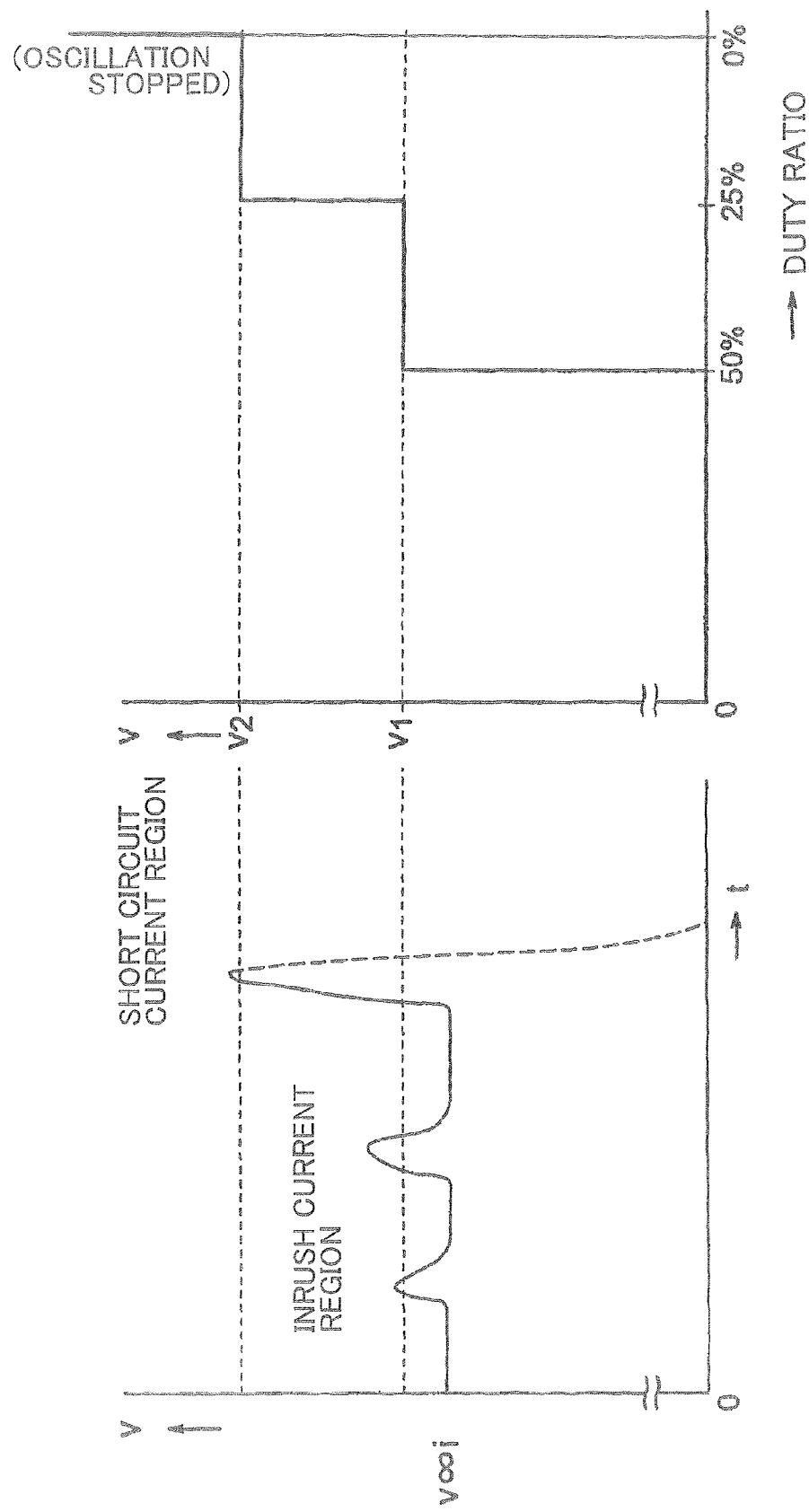
FIG. 5 is a diagram for explaining the duty ratio of rectangular pulses outputted by an oscillator circuit. (first embodiment)

FIG. 5 is a diagram for explaining the duty ratio of the rectangular pulses outputted by the oscillator circuit.

The arrangement of the oscillator circuit 8 (shown in FIG. 1) and oscillation frequency of the rectangular pulses outputted by the oscillator circuit 8 are described later; the duty ratio of the rectangular pulses produced by the oscillator circuit 8 is set so that, as shown on the left-hand side of FIG. 5, when the voltage supplied from the above-mentioned OR circuit 7 is no greater than the illustrated $v_1$ the duty ratio is 50%, when the voltage supplied from the OR circuit 7 is $v_2$ or greater than $v_2$ the duty ratio is 0% (i.e. this is oscillation is stopped), and when the voltage supplied from the OR circuit 7 exceeds the illustrated $v_1$ but is less than $v_2$ the duty ratio is 25%.

As described above, in the case of inrush current flowing into the capacitive load 1, as shown by the 'inrush current region' on the left-hand side in FIG. 5, the output from the OR circuit 7 might momentarily exceed the above-mentioned voltage $v_1$ but does not attain the voltage $v_2$ (designed so as not to attain), but when a short circuit is generated, as shown by the 'short circuit current region' on the left-hand side in FIG. 5, the output from the OR circuit 7 exceeds the voltage $v_2$.

From the above, in the case of the arrangement shown in FIG. 1, when a short circuit occurs, the oscillator circuit 8 stops oscillating (that is, the duty ratio becomes 0%), whereas when the inrush current increases to some extent the oscillator circuit 8 continues to oscillate with the rectangular pulses having a duty ratio of 50% only temporarily changing to rectangular pulses having a duty ratio of 25%.

As described above, since the short pulse generation circuit 9 generates short pulses having a predetermined duty ratio based on the output from the oscillator circuit 8, even if the duty ratio of the oscillator circuit 8 changes from 50% to 25% as described above, there is no change in the duty ratio of the pulse wave supplied to the gate drive circuit 10 illustrated. However, when a short circuit is generated, the oscillator circuit 8 stops oscillation, the short pulse generation circuit 9 also stops generating short pulses, and as a result, ON/OFF operation of the switching elements SW1 to SW4 in the switching circuit 3 stops.

In the present invention, the value for a secondary side leakage inductance $L_1$ of the pulse transformer 4 is obtained from $$L_1=(\tau_0/\pi)^2\times(1/C_1)$$

wherein the capacitance of the capacitive load 1 is $C_1$ and the pulse width of the pulse wave component is $\tau_0$.

That is, the secondary side leakage inductance of the pulse transformer 4 is selected for the pulse width $\tau_0$ by the capacitance $C_1$ of the capacitive load 1 irrespective of the pulse repetition period.

The 'secondary side leakage inductance $L_1$ of the pulse transformer 4' referred to in the present application means an 'equivalent inductance' including lead wires on the secondary side of the pulse transformer 4 and inductive elements (not illustrated) additionally inserted into the secondary side.

Furthermore, the short pulse generation circuit 9 is adjusted so that the pulse width $\tau_0$ of the pulse wave component satisfies $$\tau_0 = \pi \sqrt{L_1} \sqrt{C_1}$$

where the capacitance of the capacitive load 1 is $C_1$ and the secondary side leakage inductance of the pulse transformer 4 is $L_1$.

Moreover, as shown later in FIG. 8, for example, the value for the secondary side leakage inductance $L_1$ of the high voltage pulse transformer when the pulse width is $\tau_0=10$ μs and the load capacitance is $C_1=200$ pF is given by $$\begin{aligned} L_1 &= (\tau_0/\pi)^2 \times (1/C_1) \\ &= 0.0507[H] \\ &= 50.7[mH]. \end{aligned}$$

Figure 6:
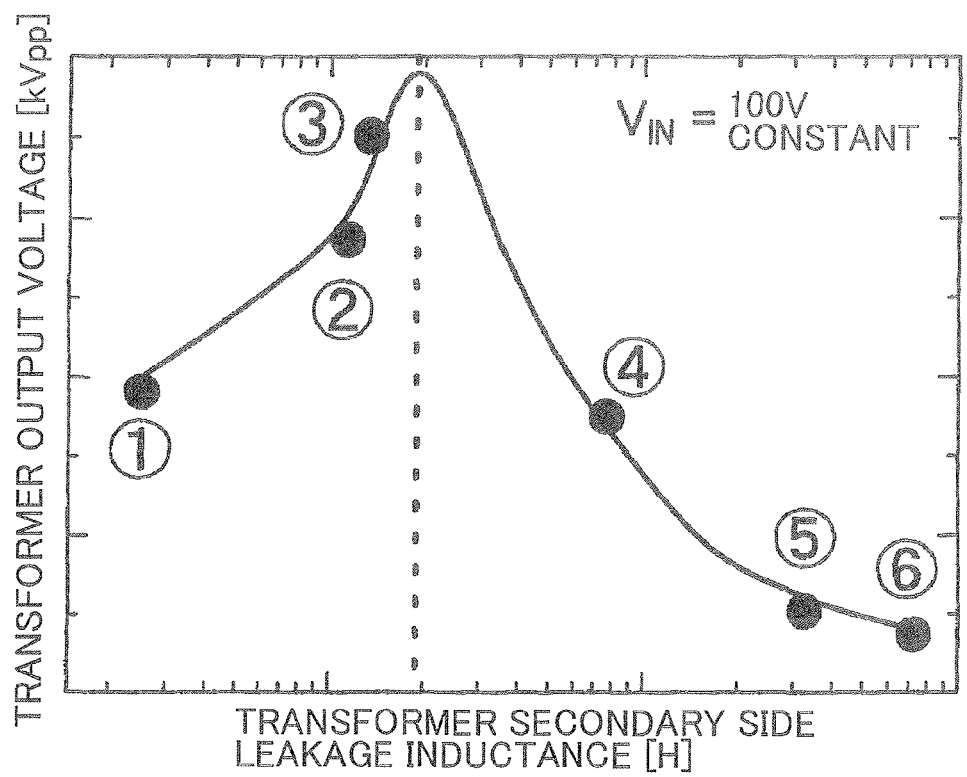
FIG. 6 is a plot of measurement of pulse transformer output voltage peak value [kVpp] against selected secondary side leakage inductance [H] of the pulse transformer. (first embodiment)

FIG. 6 is a plot of measurement of pulse transformer output voltage peak value [kVpp] given by selecting the secondary side leakage inductance [H] of the pulse transformer.

The curve in FIG. 6 is a line smoothly joining the plotted points.

Figure 7:
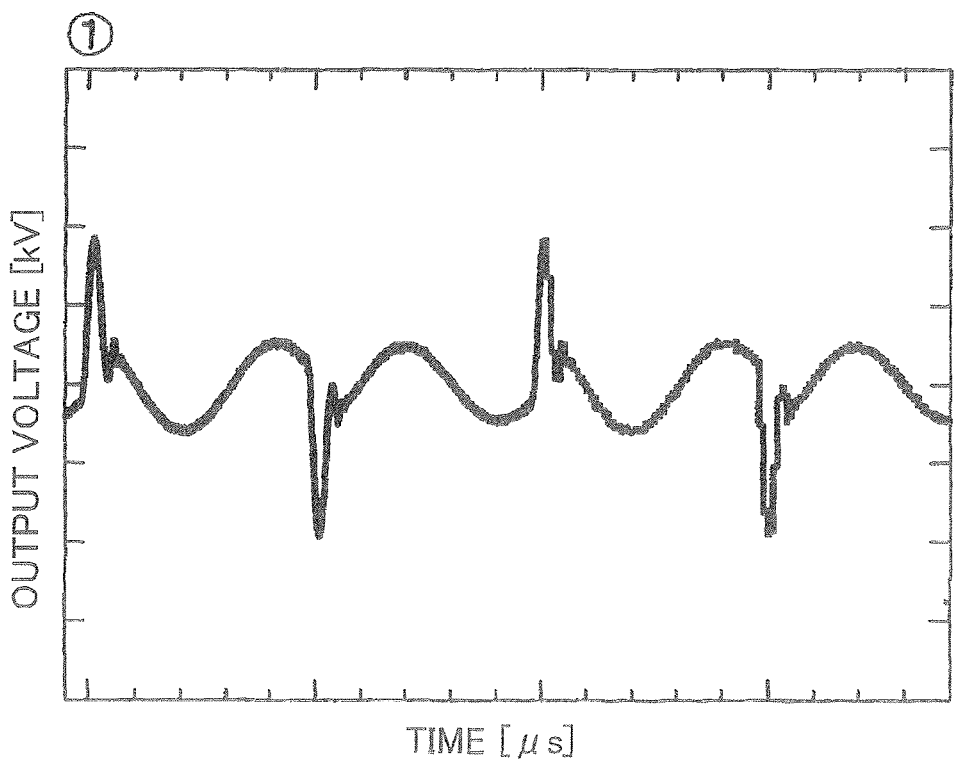
FIG. 7 is a diagram showing a voltage waveform applied to the capacitive load 1 shown in FIG. 1 when a pulse transformer secondary side leakage inductance having a value corresponding to point [1] in FIG. 6 is selected. (first embodiment)
Figure 8:
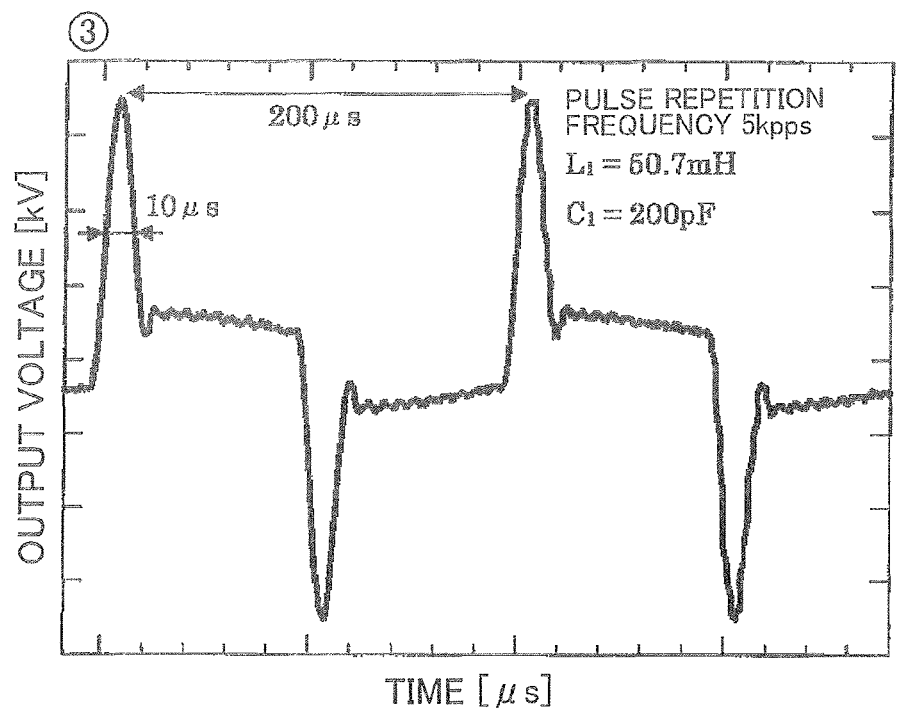
FIG. 8 is a diagram showing a voltage waveform applied to the capacitive load 1 shown in FIG. 1 when a pulse transformer secondary side leakage inductance having a value corresponding to point [3] in FIG. 6 is selected. (first embodiment)
Figure 9:
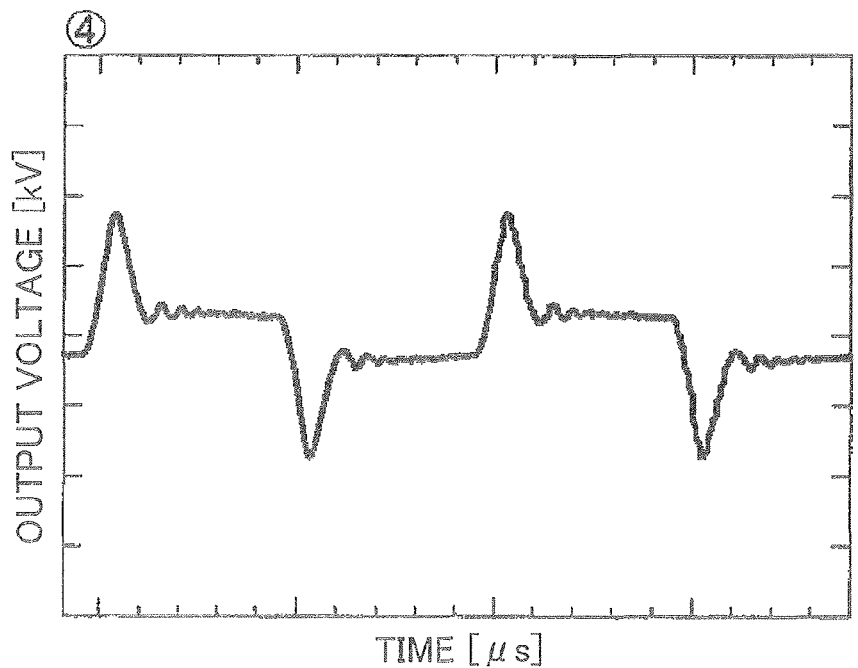
FIG. 9 is a diagram showing a voltage waveform applied to the capacitive load 1 shown in FIG. 1 when a pulse transformer secondary side leakage inductance having a value corresponding to point [4] in FIG. 6 is selected. (first embodiment)

FIG. 7 to FIG. 9 are diagrams showing the voltage waveforms applied to the capacitive load 1 shown in FIG. 1 when secondary side leakage inductances of the pulse transformer having values corresponding to points [1], [3], and [4] in FIG. 6 respectively are selected.

FIG. 7 shows the waveform when the secondary side leakage inductance of the pulse transformer is displaced in a direction in which the inductance is decreased from that, corresponding to the dotted line shown in FIG. 6, at which it is considered to be an optimum. The waveform denoted by '[9] DBD load output' shown in FIG. 2 is actually observed as the waveform shown in FIG. 7.

FIG. 8 shows the waveform when it is relatively close to the secondary side leakage inductance of the pulse transformer that is considered to be an optimum, which corresponds to the dotted line shown in FIG. 6.

FIG. 9 shows the waveform when the secondary side leakage inductance of the pulse transformer is displaced in a direction in which it is increased from that, corresponding to the dotted line shown in FIG. 6, at which it is considered to be an optimum.

"So as to become a value that corresponds" referred to in the expression 'the secondary side leakage inductance of the pulse transformer being given a value such that half a cycle of oscillating voltage generated by the secondary side leakage inductance of the pulse transformer and the capacitance of the capacitive load is a value corresponding to the pulse width of the ON period when the switching element is turned ON/OFF' of Claim 1 of the present application means that the secondary side leakage inductance of the pulse transformer is selected so as to be within a range of point [1] to point [4] shown in FIG. 6. When it is selected to be point [1] or point [4], a value that is substantially half the value of the transformer output voltage [kVpp] obtained when the inductance is selected to be the optimum value is outputted.

As hereinbefore explained, in the present invention, the design is such that an oscillating wave generated by the secondary side leakage inductance of the pulse transformer and the capacitance of the capacitive load does not resonate with the repetition period of the whole triangular wave-shaped waveform shown as '[9] DBD load output' shown in FIG. 2, but preferably has half a cycle that is comparable to the pulse width $\tau_0$ of the pulse-shaped component at the beginning of the triangular wave-shaped waveform. Because of this, as shown in FIG. 6 to FIG. 9, the peak value of the voltage applied to the capacitive load 1 is greatly increased.

In the case of the present invention, even when the repetition period of the positive peak and the negative peak applied to the capacitive load 1 is changed, it is unnecessary to change the above-mentioned condition given by $L_1=(\tau_0/\pi)^2\times(1/C_1)$. That is, even if the pulse repetition period is freely changed, a voltage with a high peak value is applied.

This shows that the arrangement in which the duty ratio is changed according to the size of the DC current component, which is explained by reference to FIG. 1, does not have an undesirable influence.

Needless to say, in those shown by Patent Document 1 and Patent Document 2, the period of the resonant frequency occurring due to the capacitance and the inductance occurring in the circuits in Patent Document 1 and Patent Document 2 above is made equivalent, 1 to 1, to the repetition period of the positive peak and the negative peak applied to the capacitive load 1.

The invention claimed is:

1. A device for applying a high voltage using a pulse voltage that applies a high voltage having a steep leading edge to a capacitive load, comprising:
   a pulse transformer;
   a switching circuit that supplies a pulse wave having a steep leading edge to the capacitive load via the pulse transformer,
   the switching circuit having a plurality of switching elements that are turned ON/OFF by gate control;
   an oscillator circuit configured to generate a signal having a predetermined duty ratio of α%, a duty ratio of 0%, and at least an intermediate duty ratio of β(α>β>0) % that is between said duty ratio of α% and a duty ratio of 0%; and
   a short pulse generation circuit that generates a short pulse corresponding to an ON voltage only during a predetermined period corresponding to a leading edge of a rectangular pulse output from said oscillator circuit, wherein
   the switching elements are gate controlled based on said short pulse,
   an output from the switching circuit applies a voltage to the capacitive load via the pulse transformer, and
   a secondary side leakage inductance $L_1$ of the pulse transformer has a value such that half a cycle of oscillating voltage generated by the secondary side leakage inductance of the pulse transformer and the capacitance of a capacitive corresponds to a pulse width $\tau_0$ of an ON period when at least one of the switching elements is turned ON/OFF; wherein
   the value of the secondary side leakage inductance $L_1$ of the pulse transformer and a value of the pulse width $\tau_0$ of the pulse wave are given so as to satisfy the following equation $$L_1=(\tau_0/\pi)^2\times(1/C_1)$$

wherein $C_1$: capacitance of the capacitive load.

2. The device for applying a high voltage using a pulse voltage according to claim 1, wherein, with regard to a DC current component flowing into the switching circuit, the oscillator circuit is arranged so as to take one of a predetermined duty ratio of α%, a duty ratio of 0%, and at least an intermediate duty ratio of β (α>β>0) % that is between said duty ratio of α% and the duty ratio of 0% based on the value of a larger voltage component which is the larger of a proportional voltage component that is proportional to said DC current component, and an integrated voltage component that is said DC current component integrated with a predetermined time constant.

3. A method of applying a high voltage using a pulse voltage, the method applying a high voltage by a device in which, in order to use a pulse voltage that applies a high voltage having a steep leading edge to a capacitive load,
   a switching circuit supplying a pulse wave with a steep leading edge via a pulse transformer and having a plurality of switching elements that are turned ON/OFF by gate control is used together with
   an oscillator circuit configured to generate a signal having a predetermined duty ratio of $\alpha$%, a duty ratio of 0%, and at least an intermediate duty ratio of $\beta$ ($\alpha > \beta > 0$) % that is between said duty ratio of $\alpha$% and said duty ratio of 0%,
   the device being arranged so that a short pulse is generated that generates an ON voltage only during a predetermined period corresponding to a leading edge of a rectangular pulse output from said oscillator circuit, the switching elements are gate controlled based on said short pulse, and
an output from the switching circuit applies a pulse voltage to the capacitive load via the pulse transformer, characterized in that
a value for a secondary side leakage inductance $L_1$ of the pulse transformer and a value for a pulse width $\tau_0$ of the pulse wave are given so as to satisfy the following equation $$L_1 = (\tau_0/\pi)^2 \times (1/C_1)$$

wherein $C_1$: capacitance of the capacitive load.

* * * * *